(12) United States Patent
Fan et al.

(10) Patent No.: US 11,303,579 B1
(45) Date of Patent: Apr. 12, 2022

(54) SYSTEM AND METHOD FOR ADMITTANCE MODEL IDENTIFICATION FOR INVERTER-BASED RESOURCES

(71) Applicant: University of South Florida, Tampa, FL (US)

(72) Inventors: Lingling Fan, Tampa, FL (US); Zhixin Miao, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 17/016,917

(22) Filed: Sep. 10, 2020

Related U.S. Application Data

(60) Provisional application No. 62/898,067, filed on Sep. 10, 2019.

(51) Int. Cl.
| | |
|---|---|
| *H04L 47/70* | (2022.01) |
| *H03H 1/00* | (2006.01) |
| *G01R 19/25* | (2006.01) |
| *G01R 19/145* | (2006.01) |

(52) U.S. Cl.
CPC .......... *H04L 47/70* (2013.01); *G01R 19/2513* (2013.01); *H03H 1/00* (2013.01); *G01R 19/145* (2013.01); *H02J 2203/20* (2020.01)

(58) Field of Classification Search
None
See application file for complete search history.

(56) References Cited

U.S. PATENT DOCUMENTS

| | | | |
|---|---|---|---|
| 2014/0172125 A1* | 6/2014 | Shokooh | G05B 13/04 700/29 |
| 2018/0120368 A1 | 5/2018 | Liu et al. | |

OTHER PUBLICATIONS

Saad et al. ("A dq-Domain Impedance Measurement Methodology for Three-Phase Converters in Distributed Energy Systems" (2018) Energies. 11. 2732.) (Year: 2018).*

Alassaf, A. et al., Randomized Dynamic Mode Decomposition for Oscillation Modal Analysis, DOI 10.1109/TPWRS.2020.3012419, IEEE Transactions on Power Systems, Dec. 2020.

Almunif, A. et al., A tutorial on data-driven eigenvalue identification: Prony analysis, matrix pencil, and eigensystem realization algorithm, Int Trans Electr Energ Syst. 2020;30:e12283.

Rygg, A. et al., Apparent Impedance Analysis: A Small-Signal Method for Stability Analysis of Power Electronic-Based Systems, IEEE Journal of Emerging and Selected Topics in Power Electronics, vol. 5, No. 4, Dec. 2017, pp. 1474-1486.

(Continued)

*Primary Examiner* — Roy Y Yi
(74) *Attorney, Agent, or Firm* — Molly L. Sauter; Smith & Hopen P.A.

(57) ABSTRACT

A system and method for obtaining frequency-domain admittance/impedance using a few sets of time-series data. Utilizing an Eigensystem Realization Algorithm (ERA) or a dynamic mode decomposition (DMD), the input/output frequency-domain model reflecting voltage/current relationship is identified, and admittance/impedance identification is demonstrated for a grid-connected inverter-based resource (IBR) system. The proposed approach provides a powerful tool to replace the state-of-the-art harmonic injection methodology.

20 Claims, 15 Drawing Sheets

(56) References Cited

OTHER PUBLICATIONS

Sanchez-Gasca, J.J. et al., Computation of Power System Low-Order Models from Time Domain Simulations Using a Hankel Matrix, IEEE Transactions on Power Systems, vol. 12, No. 4, Nov. 1997, pp. 1461-1467.

Crow, M. et al., Identification of electromechanical modes in power systems, IEEE Power & Energy Society, Technical Report PES-TR15, ISBN 978-1-4799-1000-7, Formerly TP462, Jun. 2012.

Juang, J-N. et al., An Eigensystem Realization Algorithm for Modal Parameter Identification and Model Reduction, J. Guidance, Sep.-Oct. 1985, vol. 8, No. 5, pp. 620-627.

Ciobotaru, M. et al., On-line grid impedance estimation based on harmonic injection for grid-connected PV inverter, Conference: Proc. IEEE International Symposium on Industrial Electronics (ISIE)at: Vigo, Spain, 2007, 2437-2442.

Ciobotaru, M. et al., Online grid impedance estimation for single-phase grid-connected systems using PQ variations, 2007 IEEE Power Electronics Specialists Conference, Orlando, FL, 2007, pp. 2306-2312.

Schmid, P. et al., Dynamic mode decomposition of numerical and experimental data. Journal of Fluid Mechanics, Cambridge University Press (CUP), 2010, 656 (August), pp. 5-28.

Valdivia, V. et al., Impedance Identification Procedure of Three-Phase Balanced Voltage Source Inverters Based on Transient Response Measurements, IEEE Transactions on Power Electronics, vol. 26, No. 12, Dec. 2011, 3810-3816.

\* cited by examiner

SYSTEM AND METHOD FOR ADMITTANCE MODEL IDENTIFICATION FOR INVERTER-BASED RESOURCES

BACKGROUND OF THE INVENTION

Unprecedented dynamic phenomena appear in power grids due to integration of more and more inverter-based resources (IBR) (e.g., wind and solar) A major challenge is that inverter models are proprietary information and usually only real code models are provided to grid operators. Thus, measurement-based characterization of IBRs is a popular approach to find the frequency domain measurements of an IBR's admittance or impedance. The predominant methods rely on injecting perturbation and extracting frequency-domain information via Fast Fourier Transformer (FFT).

High penetration of IBRs introduce many new dynamic phenomena into power grids. First, severe wind farm sub-synchronous oscillations (SSO) due to wind interactions with RLC circuits occurred in Texas in 2009. Similar phenomena were observed in North China in the years that followed. In 2017, three more events were observed. Oscillations were also observed in real-world wind farms with weak grid interconnection. For voltage source converter (VSC)-based HVDC (high-voltage direct current) with weak grid interconnection, stability issues have also been identified.

While electromagnetic (EMT)-type simulation in environments such as PSCAD and MATLAB/SimPowerSystems, is the major tool for dynamic study, EMT simulation mainly serves as a validation tool, instead of an analysis tool. To facilitate small-signal analysis, linear models are desired.

Details of inverters are usually proprietary information and are not completely released to grid operators. Measured impedances, through known frequency scanning or harmonic injection methods, thus serve as important characteristics for those devices. Impedance-based stability analysis has been popularly used in the power electronics field as well as type-3 wind SSO screening studies.

Currently, the predominant technology for ISR characterization is frequency-domain measurement. Two types of methods are employed to find impedance/admittance measurements. The first type, the harmonic injection method or the frequency scanning method relies on setting up a measurement testbed for an IBR only. A device is first connected to a 60 Hz voltage source to operate at certain operating condition. To have voltage perturbation, an additional voltage source with small magnitude at a certain frequency is connected in series with the original voltage source. The current component at that frequency will be measured using Fast Fourier Transformation (FFT) and the current/voltage phasor relationship at this frequency is then obtained. An additional step, vector fitting must be carried out to obtain an input/output model described in either state-space or transfer function.

The second type does not require a measurement testbed. Rather, an additional hardware device, impedance measurement unit (IMU), is installed in a system in operation. It injects series voltage perturbation, collects both voltage and current measurements' frequency-domain information through FFT and computes dq-frame impedance measurements.

Both methods require repeated sinusoidal injections and FFT analysis. To speed up the process, different types of injection signals have been proposed and implemented in IMUs, e.g., chirp signal. Nevertheless, the current IMUs all rely on injections and FFT to lead to impedance at frequency points.

Accordingly, what is needed in the art is an improved system and method for generating an impedance or admittance model of an inverter-based resource (IBR) that does not rely on numerous experiments requiring harmonic injection and frequency scan methods.

SUMMARY OF THE INVENTION

In various embodiments, the present invention provides a system and method for time-domain measurement-based admittance identification so that event data can be utilized for admittance identification, in real-time.

In one embodiment, the present invention provides a method for admittance identification of a grid-connected inverter-based resource (IBR), which includes, capturing transient data in response to at least two independent time-domain events on a bus between a grid-connected IBR and a power grid and identifying a dq-frame admittance model of the IBR from the captured transient data.

In a particular embodiment, the at least two independent time-domain events are voltage perturbations on the bus and the method includes capturing and recording a transient current flowing to the IBR and a transient voltage time-series data at a terminal voltage of the IBR.

The method may further include, applying an Eigensystem Realization Algorithm (ERA) to the sampled transient data to generate an s-domain expression of the transient data. Alternatively, the method may include, applying dynamic mode decomposition (DMD) to the sampled transient data to generate an s-domain expression of the transient data.

In an additional embodiment, the invention provides a system for measuring an admittance of a grid-connected inverter-based resource (IBR). The system includes a measurement unit coupled to a point of interconnection (POI) between a power grid and an inverter-based resource (IBR). The measurement unit is configured for capturing transient data in response to at least two independent time-domain events on a bus between the IBR and the power grid and for identifying a dq-frame admittance model of the IBR from the captured transient data.

The measurement unit may comprise hardware circuitry and software components that are well known in the art for measuring voltages and currents at a point of interest.

The embodiments of the present invention replace the harmonic injection and frequency scan methods currently known in the art that require numerous experiments. The present invention thereby provides an improved system and method for performing admittance measurements for inverter-based resources (IBRs), such as wind and solar farms.

BRIEF DESCRIPTION OF THE DRAWINGS

For a fuller understanding of the invention, reference should be made to the following detailed disclosure, taken in connection with the accompanying drawings, in which.

DETAILED DESCRIPTION OF THE INVENTION

Figure 1:
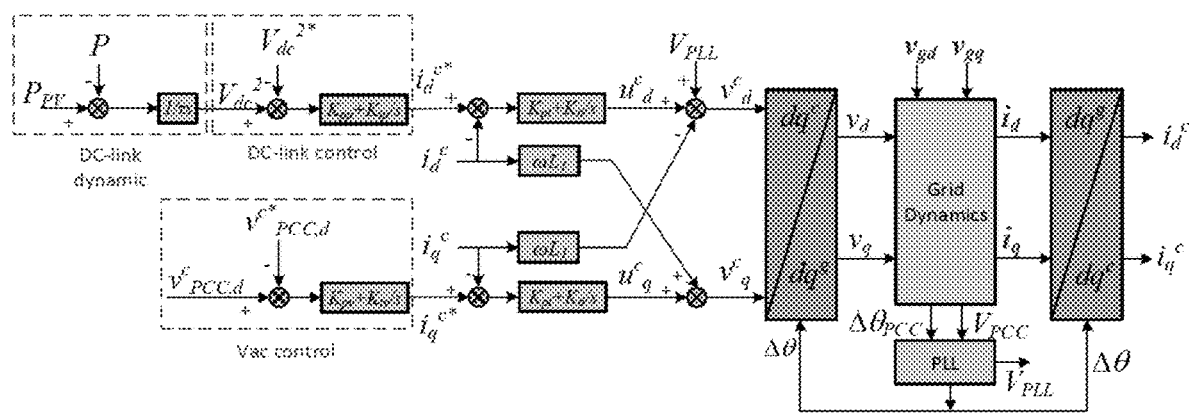
FIG. 1 is a block diagram of an analytical dq-frame model, in accordance with an embodiment of the present invention.

Modern renewable energy resources generating devices (e.g. solar and wind), are interfaced to the grid through inverter technology, such as inverter-based resources (IBR). Inverters and IBRs consist of power electronics that drive the electrical control and performance of these resources. Measured impedances of the inverter-based resources serve as important characteristics for impedance-based stability analysis. The results of the impedance-based stability analysis can be used to control the operation of the IBR and improve the grid stability.

The state-of-the-art technology for obtaining an impedance model of a device requires numerous repeated harmonic injections to generate a Bode plot. To overcome the deficiencies of the state-of-the art technology, in various embodiments, the present invention provides a system and method for obtaining a dq-frame admittance from time-domain signals. Dq-frame admittance has been shown to be able to accurately predict stability. In addition, frequency coupling phenomenon observed for converters in the static frame is not a concern in the dq-frame.

Compared to a known frequency scanning method, which relies on a measurement testbed and which requires repeated sinusoidal injections, leading to measurements at frequency points, a simpler experiment design is desired. Further, an input/output model, such as an s-domain model is desired. With the s-domain admittance model, eigenvalue analysis that predicts system stability is possible.

Compared to another known method that requires an additional hardware device to inject perturbations to a system to obtain measurements, there are plenty of event data generated during IBR operation in a power grid, which can be utilized by the present invention to obtain an admittance model. A method of admittance identification without any perturbation injection and capable of utilizing transient response data captured for events is appealing.

In the present invention, ERA (eigensystem realization algorithm) and DMD (dynamic mode decomposition) are used to convert time-domain data to a corresponding s-domain expression. This capability further opens the door to an application with a high practical value: using event data to extract an MR's admittance in real-time.

In various embodiments, the present invention provides a novel procedure that leads to dq-frame admittance identification using time-domain event data, e.g., step response data or load tripping data. In this procedure, two sets of data from two events lead to a dq-frame admittance. The method relies on a critical technology that converts time-domain signals into s-domain expressions. This technology employs ERA or DMD to accurately estimate eigenvalues and residuals to construct the s-domain expressions. In addition, since IBRs employ power electronic converters, and harmonics are common in signals, an efficient denoising technique to cancel harmonics has been proposed, tested and shown efficacy.

The present invention additionally provides a real-time dq-frame admittance identification method using data from multiple events. Compared to the existing impedance measurement (IMU) technology, the proposed method does not require any additional hardware device to inject perturbations.

ERA assumes that the dynamic response is due to and impulse input. Consider a Linear-Time Invariant (LTI) system in the discrete domain as the following:

$$x_{k+1}=Ax_k+Bu_k, y_k=Cx_k+Du_x \quad (1)$$

where $y \in \mathbb{R}^{K \times 1}$ is defined as the output column vector of the system with K output channels, $A \in \mathbb{R}^{n \times n}$, $B \in \mathbb{R}^{n \times 1}$, $C \in \mathbb{R}^{K \times n}$, and $D \in \mathbb{R}^{K \times 1}$ are system matrices.

It is noted that ERA does not lead to an input/output model due to the assumption of impulse input. Rather, ERA leads only to the s-domain expression of the measurement data. Input to ERA is the measurement data sampled at equal intervals, notated as $y_1, y_2, \ldots y_N$. The output from ERA is the state-space model defined by A, B, C, D matrices. The rank of the system n is an assumption fed to the algorithm. Eigenvalues of the continuous system ω can be found as $\omega_j=\ln(\lambda_j)/\Delta t$, where $\lambda_j$ is an eigenvalue of A and $\Delta t$ is the time interval.

The s-domain expression of y can be found as:

$$y(s) = C(sI-A)^{-1}B = \underbrace{CV}_{\Phi}(sI-\Omega)^{-1}\underbrace{V^{-1}B}_{b} \qquad (2)$$

where V is the right eigenvector matrix of A and $\Omega$ is the diagonal matrix of continuous system eigenvalues.

For $k^{th}$ measurement, its s-domain expression can be found as:

$$y_k(s) = \sum_{j=1}^{n} \frac{\phi_{kj}b_j}{s-\omega_j} \qquad (3)$$

Assuming $x_0=0$, the system response due to an impulse input ($u_0=1$, $u_k=0$, k>0) can be found as follows:

$$x_0=0, x_1=B, x_2=AB, \ldots, x_k=A^{k-1}B$$

$$y_0=D, y_1=CB, y_2=CAB, \ldots, y_k=CA^{k-1}B$$

A critical step of ERA is to construct two shifted Hankel matrices.

$$H_1 = \begin{bmatrix} y_1 & y_2 & \cdots & y_L \\ y_2 & y_3 & \cdots & y_{L+1} \\ \vdots & \vdots & \ddots & \vdots \\ y_{N-L+1} & y_{N-L+2} & \cdots & y_N \end{bmatrix}_{K(N-L+1)\times L} \qquad (4)$$

$$H_2 = \begin{bmatrix} y_2 & y_3 & \cdots & y_{L+1} \\ y_3 & y_4 & \cdots & y_{L+2} \\ \vdots & \vdots & \ddots & \vdots \\ y_{N-L+2} & y_{N-L+3} & \cdots & y_N \end{bmatrix}_{K(N-L+1)\times L} \qquad (5)$$

It can be seen that the Hankel matrices can be decomposed as follows:

$$H_1 = \begin{bmatrix} CB & CAB & \cdots & CA^{L-1}B \\ CAB & CA^2B & \cdots & CA^LB \\ \vdots & \vdots & \vdots & \vdots \\ CA^{L-N}B & CA^{L-N+1}B & \cdots & CA^{N-1}B \end{bmatrix} = \qquad (6)$$

$$\underbrace{\begin{bmatrix} C \\ CA \\ \vdots \\ CA^{N-L} \end{bmatrix}}_{\mathcal{O}} \underbrace{[B \quad AB \quad \cdots \quad A^{L-1}B]}_{\mathcal{C}}$$

$$\Rightarrow H_1 = \mathcal{OC} \qquad (7)$$

$$\Rightarrow H_2 = \mathcal{OAC} \qquad (8)$$

where $\mathcal{O}$ is the observability matrix and $\mathcal{C}$ is the controllability matrix. ERA employs singular value decomposition (SVD) and rank reduction to find two matrices to realize $\mathcal{O}$ and $\mathcal{C}$. Further, A matrix can be found by exploring the relationship between $H_1$ and $H_2$. Details of ERA implementation are well known in the art and can be found in the literature, and as such, have been omitted from this disclosure.

Though ERA leads to a state matrix, the state variables are unknown. On the other hand, DMD results in a state matrix $A(x_{k+1}=Ax_k)$ with the state variables x clearly defined as the measurements, where $x_k \in \mathbb{R}^n$ and $A \in \mathbb{R}^{n \times n}$. The time interval between two consecutive snapshots is $\Delta_t$.

Applying eigen-decomposition to matrix $A(A=\Phi\Lambda\Phi^{-1})$ leads to:

$$x_{k+1} = \Phi\Lambda\Phi^{-1}x_k = \Phi\Lambda^2\Phi^{-1}x_{k-1} = \ldots = \Phi\Lambda^k\underbrace{\Phi^{-1}x_1}_{b} \qquad (9)$$

where $b \in \mathbb{C}^{n \times 1}$, $\Phi \in \mathbb{C}^{n \times n}$ is the right eigen vector matrix of A and $\Lambda$ is a diagonal matrix with elements as $\lambda_i$, i=1, \ldots, n.

Equation (9) can also be written as follows:

$$x_{k+1} = \sum_{j=1}^{n} \phi_j \lambda_j^k b_j \qquad (10)$$

The time-domain expression of x(t) can be constructed using the eigenvalues and eigenvectors of A.

$$x(t) = \sum_{j=1}^{n} \phi_j e^{\omega_j t} b_j = \Phi e^{\Omega t} b \qquad (11)$$

where $\Omega$ is a diagonal matrix that contains the continuous-eigenvalues, $\omega_j$. The relationship between the discrete and continuous eigenvalue is $\omega_j=\ln(\lambda_j)/\Delta t$.

The inputs to the DMD algorithm are measurement data sampled at equal intervals, denoted as $x_1, x_2, \ldots, x_N$. The outputs are: the eigenvector matrix 1, the eigen value matrix $\Omega$, and the initial state projected to the eigenvector basis b. Rank of the system r should also be assumed.

A critical step in DMD is to form a data matrix X. This matrix is constructed to contain state for N snapshots with equal time-intervals.

$$X = \begin{bmatrix} | & | & & | \\ x_1 & x_2 & \cdots & x_N \\ | & | & & | \end{bmatrix} \qquad (12)$$

Following the construction of the data matrix, two shifted matrices are formed:

$$X_1^{N-1} = \begin{bmatrix} | & | & & | \\ x_1 & x_2 & \cdots & x_{N-1} \\ | & | & & | \end{bmatrix}, \qquad (13a)$$

$$X_2^N = \begin{bmatrix} | & | & & | \\ x_3 & x_3 & \cdots & x_N \\ | & | & & | \end{bmatrix}, \qquad (13b)$$

where $X_1^{N-1} \in \mathbb{R}^{n \times (N-1)}$, $X_2^N \in \mathbb{R}^{n \times (N-1)}$. The subscript and superscript refer to the first and last measurement snapshots in the set, respectively. It can be seen that:

$$X_2^N = AX_1^{N-1}$$

Matrix A can then be found by exploring the above relationship. Further details are omitted.

With DMD's outputs Φ, b and the eigenvalue vector co for continuous system, it is easy to find the s-domain expression of kth measurement signal as:

$$x_k(s) = \sum_{j=1}^{r} \frac{\phi_{kj} b_j}{s - \omega_j}$$

To illustrate proof-of-concept of the present invention, data is generated from an analytical model build in dq-frame. With the identified admittance, stability analysis is also illustrated for to verify the design.

Figure 2:
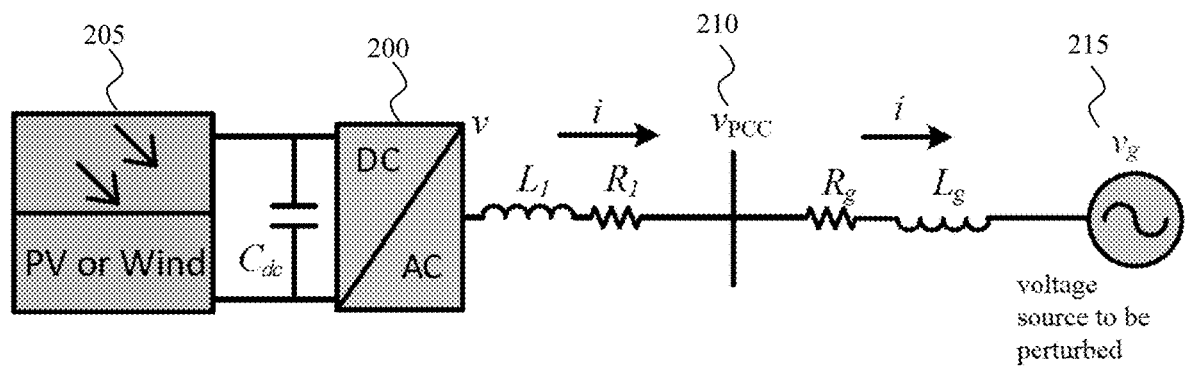
FIG. 2 is a block diagram schematically depicting a measurement testbed for a grid-connected voltage source converter (VSC) circuit, in accordance with an embodiment of the present invention.
Figure 3:
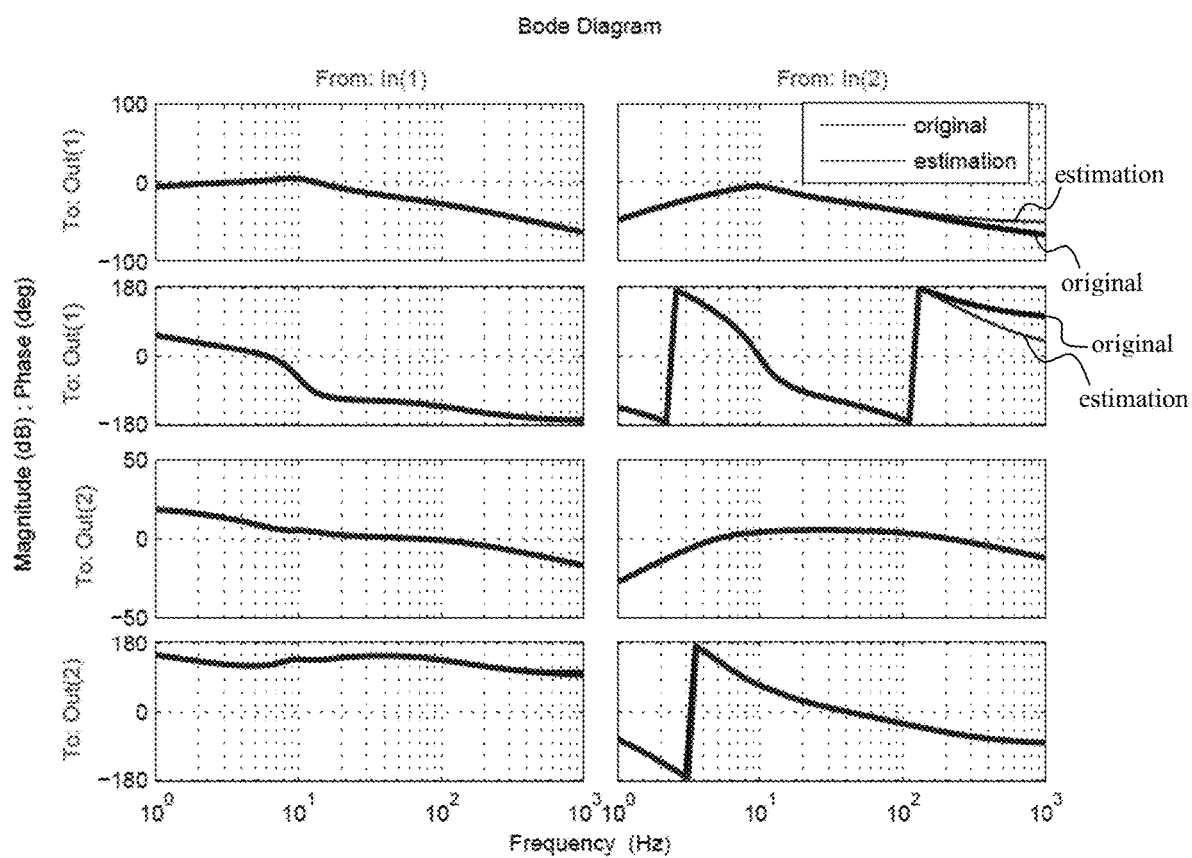
FIG. 3 illustrates Bode diagrams providing a graphical illustration of the admittance model frequency-domain responses based upon the analytical model shown in FIG. 1.

The dq-frame admittance of a grid-connected voltage source controller (VSC) 200 shown in FIG. 2 will be described. As illustrated, the VSC 200 is coupled to a photovoltaic or wind resource 205 and to a power grid 215 at a point of common coupling (PCC) 210, also known as a point of interconnection (POI)A VSC 200 with a grid-following control structure is assumed in this exemplary embodiment. The dq-frame model shown in FIG. 1 was designed and implemented. A small-signal model can be extracted from the analytical model at an operating condition through numerical perturbation. With the dq-frame grid voltage designated as an input and the current flowing out of the inverter as the output, the input/output model extracted by numerical perturbation is indeed −Y, where Y notates the admittance model. Thus, the admittance model for such a system is known, as shown in FIG. 3, where the admittance model frequency-domain responses are illustrated. This model can serve as the benchmark for the identified admittance.

The foremost challenge is how to create data that is suitable for admittance identification. In the harmonic injection method, sinusoidal perturbation is used. On the other hand, for time-domain data, Laplace transform of the step response of a system is associated with the product of the transfer function of the system and 1/s. Thus, step changes may be used as perturbations.

A step change with 0.001 pu size will be applied to $v_{gd}$. Line currents are measured and notated as $i_d^{(1)}$ and $i_q^{(1)}$. Another step change with 0.001 pu size is applied to $v_{gq}$ and the line currents are notated as $i_d^{(2)}$ and $i_q^{(2)}$. The step response data is presented in FIG. 4.

Data in the time frame from 1 second to 1.98 is used for analysis. Sampling frequency is 2500 Hz. Since ERA assumes the initial state variables are zeros, the data are processed to have the initial steady-state values taken off. Proper scaling is applied to signals to have similar degree of variation. For the four signals, the scales are 1000, 1, 100, and 10. The two sets of scaled event data are fed into the ERA.

The estimated system is assumed to have an order of 10. This order is chosen by considering the 9th order system and the step response perturbation. Given the step change input, the measurement signal should have an order of 10.

Figure 4:
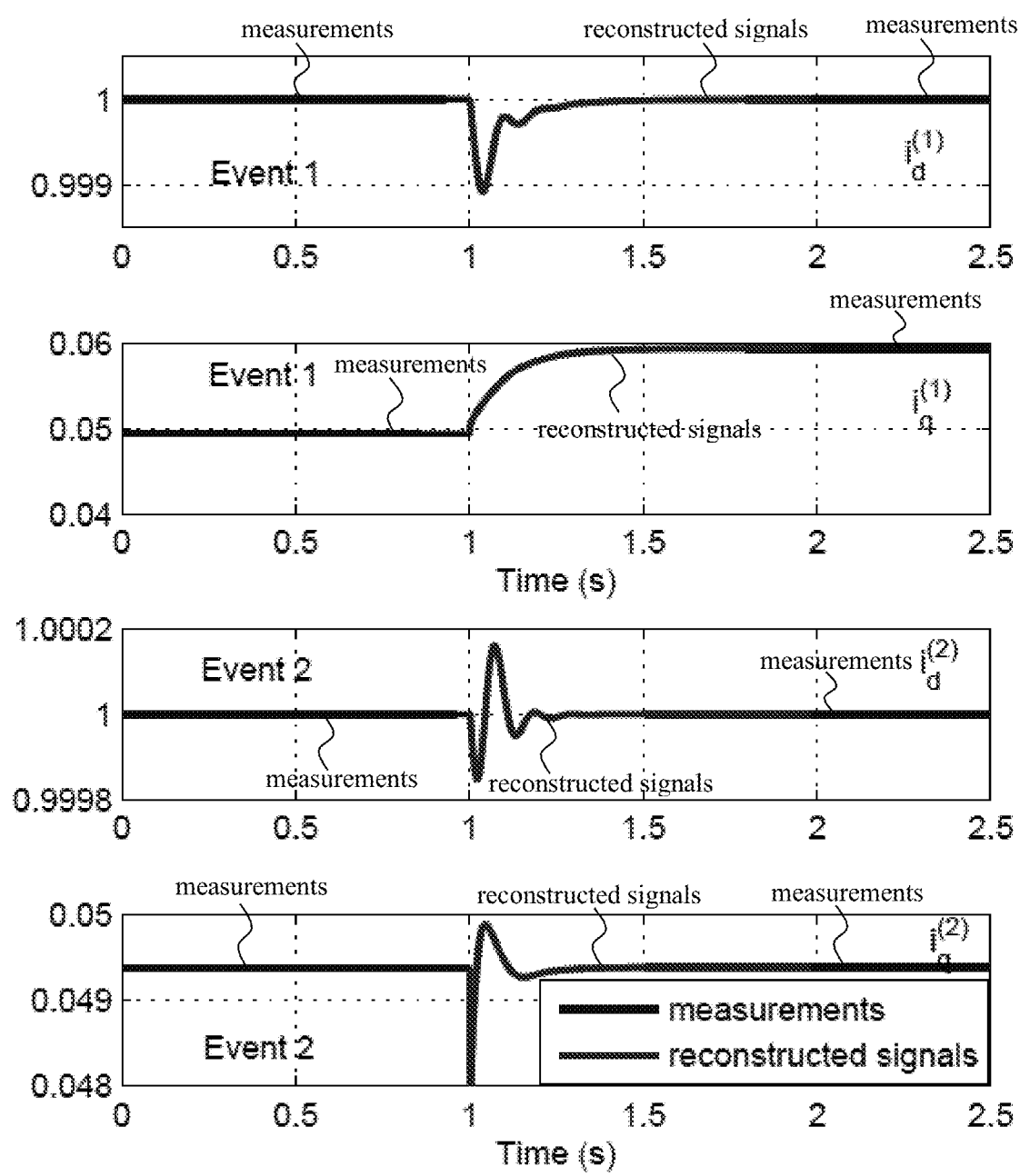
FIG. 4 is a graphical illustration of the dynamic responses of $i_d$ and $i_q$ for two events. Event 1: $v_{gd}$ step change of 0:001 pu at t=1 s. Event 2: $v_{gq}$ step change of 0:001 pu at t=1 s, in accordance with an embodiment of the present invention.

The system matrix A is first computed based on the measurement signals. The eigenvalues of the continuous system are estimated and the residuals for each signal can be computed. With the eigenvalue and residuals found, measurement data can be reconstructed, and the transfer function can be found for each signal. FIG. 4 presents the reconstructed signals with their initial steady-state values added. The reconstructed signals have a close to 100% match with the original data.

Figure 5A:
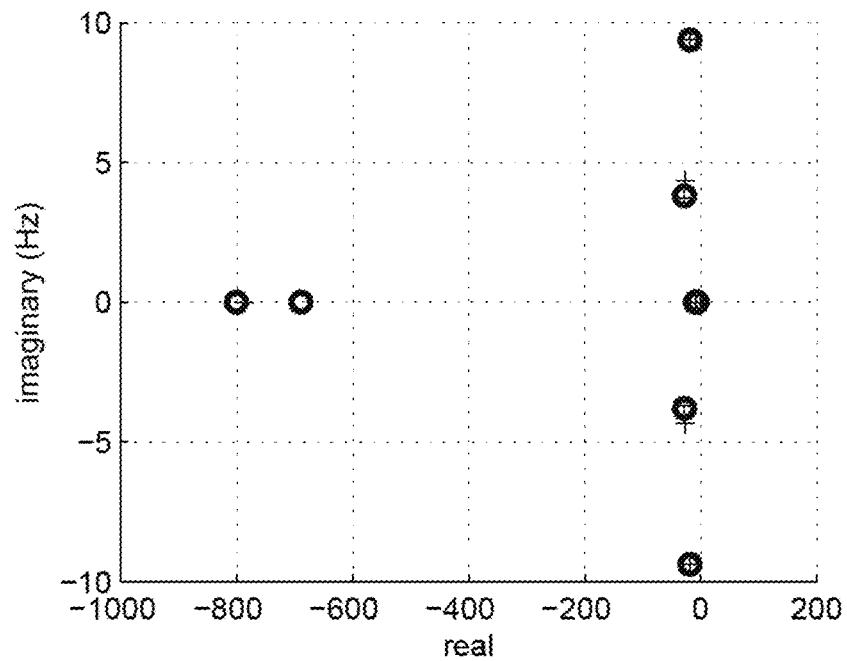
FIG. 5A is a graphical illustration of actual eigenvalues of the 9th order system and the estimation from current signals, in accordance with an embodiment of the present invention.
Figure 5B:
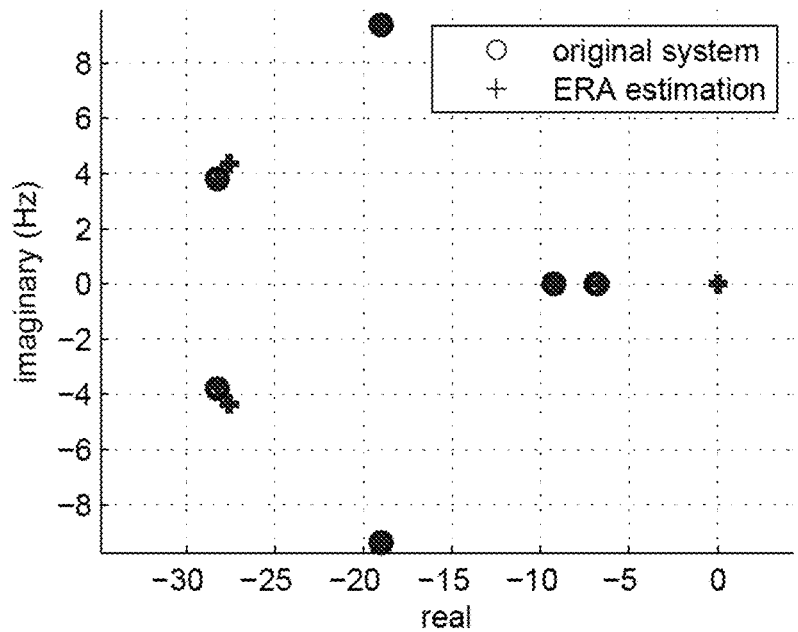
FIG. 5B is a zoomed-in view of the graphical illustration of FIG. 5A.

FIG. 5 presents the estimated eigenvalues versus the eigenvalues of the original system in the complex plane. It can be seen that the identified eigenvalues align very well with the original eigenvalues. The estimated eigenvalue at the original point is due to the step input which introduces an "s" in the denominator of the current transfer functions.

For each signal, its estimated Laplace domain expression can now be found: $i_d^{(1)}(s)$, $i_q^{(1)}(s)$, $i_d^{(2)}(s)$ and $i_q^{(2)}(s)$, where superscript notates event number. The admittance model can be found by taking into the effect of step response of $v_d$ or $v_q$.

$$Y = \frac{-s}{p} \begin{bmatrix} i_d^{(1)}(s) & i_d^{(2)}(s) \\ i_q^{(1)}(s) & i_q^{(2)}(s) \end{bmatrix} \tag{14}$$

where p is the size of perturbation. For this study, p=0:001.

FIG. 3 presents the frequency responses of the estimated admittance versus the original admittance. It can be seen that the estimated admittance provides an excellent match in the frequency range of 1 Hz to 100 Hz. Considering that grid dynamic studies are concerned about dynamics in this range, the proposed approach, using step responses of 1 second data for admittance identification, has been demonstrated as a powerful tool for device characterization.

Figure 6:
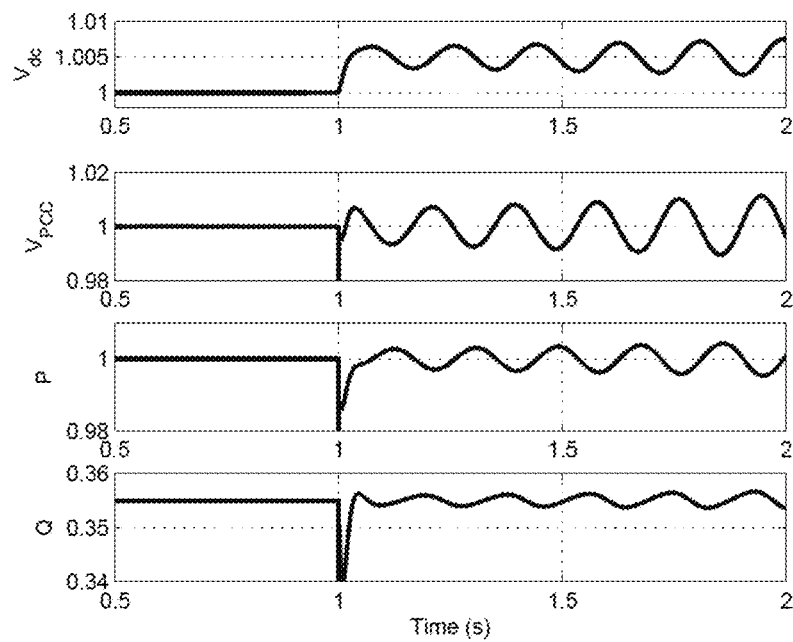
FIG. 6 is a graphical illustration of dynamic responses of the VSC grid integration system subject to 0.5% chance in dc-link voltage order, illustrating that the system is unstable with growing 5 Hz oscillations, in accordance with an embodiment of the present invention.

The analytical model shown in FIG. 1 can be used to demonstrate low-frequency oscillations when the VSC is integrated into a weak grid at $X_g$=0.8 pu. FIG. 6 presents the system response subject to a small step change in dc-link voltage order. It can be seen that the system is subject to 5 Hz oscillations.

The system is viewed at PCC (point of common coupling) bus with two shunt admittances: $Y_{VSC}$ and $Y_{line}$. Applying circuit analysis, it can be found that the relationship between the injected small current at the PCC bus and the PCC bus deviation is as follows:

$$\begin{bmatrix} \Delta i_{d,inj} \\ \Delta i_{q,inj} \end{bmatrix} = (Y_{VSC} + Y_{line}) \begin{bmatrix} \Delta V_{d,PCC} \\ \Delta V_{q,PCC} \end{bmatrix} \tag{15}$$

If (15) is viewed as an input/output system, then the PCC voltage is the output (notated as y) and the injected current is the input (notated as u). Hence, the transfer function matrix notates as G(s) from u to y is:

$$G(s) = \frac{y}{u} = \frac{(Y_{VSC} + Y_{line})^{-1}}{Y} \tag{16}$$

$$\text{where } Y_{line} = \begin{bmatrix} R_g + sL_g & -\omega_0 L_g \\ \omega_0 L_g & R_g + sL_g \end{bmatrix}^{-1} \tag{17}$$

and $\omega_0$ is the nominal frequency 377 rad/s.

Poles of G(s) are the eigenvalues of the system. In turn, roots of det(Y) or the zeroes of the s-domain admittance matrix Y are the eigenvalues of the system. With the VSC admittance identified through time-domain signals and the line admittance known, eigenvalues of the system can be found.

Figure 7:
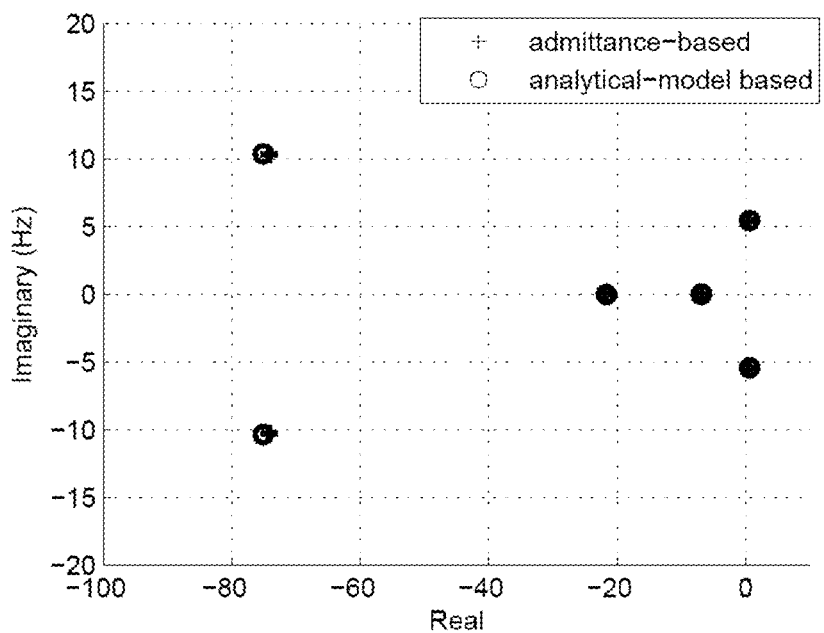
FIG. 7 is a graphical comparison of eigenvalues obtained using an admittance-based approach and an analytical model-based approach, in accordance with an embodiment of the present invention.

FIG. 7 presents the eigenvalues of the admittance-based approach and the original set. As shown, the figure illustrates an exact match.

While the data generated from the analytical model contain little noise, data generated at the real world contain noise and harmonics. In addition, the real-world physical system is usually of high order. Thus, a more sophisticated electromagnetic transient (EMT) testbed (EMT Testbed 1) is presented below for demonstration. A notable procedure on denoising is described for the ERA and DMD identification tools.

In general, the present invention provides a measurement unit that can be connected at the point of interconnection (POI) between a power grid and a solar farm or wind farm. The measurement unit captures and records transient data of voltage at the POI and the current flowing into the inverter-based resource (IBR). With voltage and current data from at least two time-domain events, an admittance model of the IBR (solar farm or wind farm) can be found.

From the admittance model, one can quickly project if the IBR interconnected system is stable or not at a certain power grid strength condition. The assumption is that the admittance model of the point of interconnection is know if a specific grid strength is assumed. One can use the admittance-based stability check for this speculation. Equations (15)-(17) illustrate how to obtain aggregated admittance of the entire system after the IBR admittance has been measured with the measurement unit. Knowing the aggregated admittance, eigenvalues of the system can be found, and a stability check can be made, as demonstrated in FIG. 5 and FIG. 14.

Figure 8A:
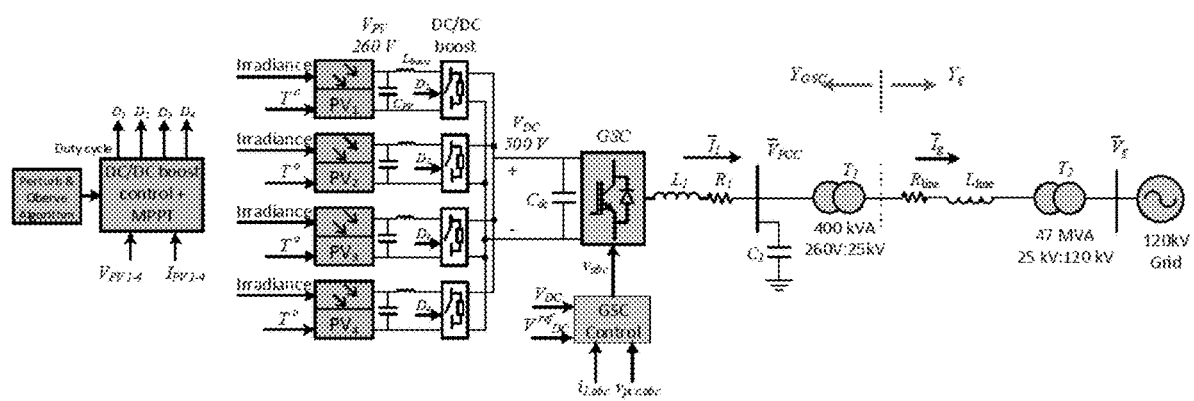
FIG. 8A illustrates an electromagnetic transient (EMT) testbed comprising a 400-kW grid-interconnected photovoltaic (PV) farm, in accordance with an exemplary embodiment of the present invention.
Figure 14:
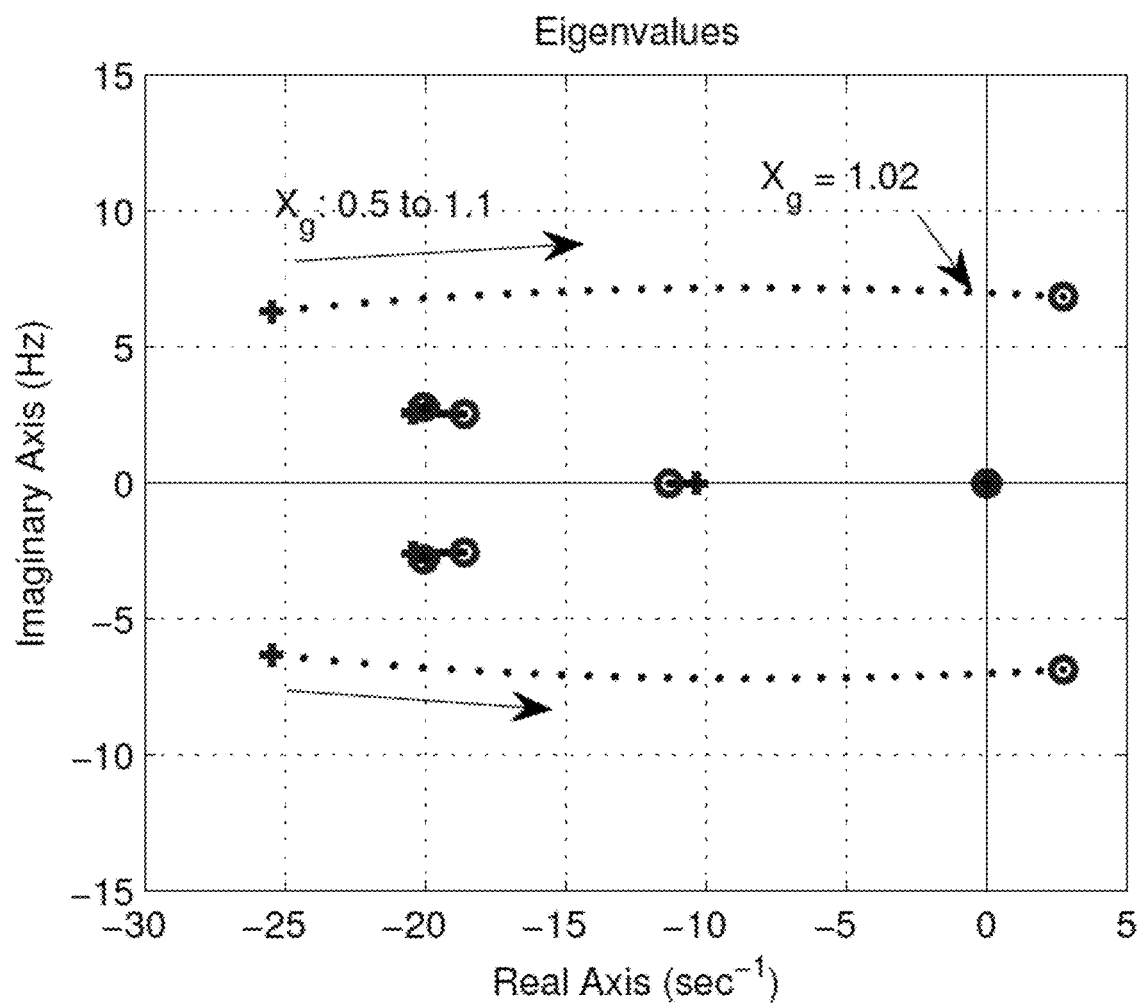
FIG. 14 is a graphical illustration of eigenvalues of the closed-loop system based on the $10^{th}$ order system from DMD, in accordance with an embodiment of the present invention.

For example, FIG. 14 indicates that for the 400-kW solar farm shown in FIG. 8A, once its admittance is measured, one can project that it can work in a grid with Thevenin equivalent impedance less than 1.02. If the grid is weaker, or the impedance is greater than 1.02, then the system loses stability and 7.7 Hz oscillations will appear.

The method of the present invention for deriving the admittance model of the IBR can be applied to any subsystem, as long as the time-domain event that trigger the transients occur outside of the subsystem.

EMT Testbed 1, shown in FIG. 8A, is build based on the demo 400-kW PV system in MATLAB/SimPowerSystems. This testbed has full dynamics modeled, including not only the grid-connected VSC average model and its control, transmission line electromagnetic dynamics, but also dc/dc boost converter average model, dc/dc boost converter control, maximum power point tracking (MPPT) and dc-side circuit dynamics. The PV voltage ($V_{PV}$) at the input side of the dc/dc boost converter is 260V. Output of the dc/dc boost converter is at 500V. The 500V dc voltage is converted to a three-phase 260 V ac power voltage by a VSC. A shunt capacitor ($C_1$) is connected on the point of common coupling (PCC) bus to compensate reactive power. There are two Y ground transformers ($T_1$, $T_2$) on transmission line and the system is connected to a 120 kV grid bus. Note that $R_g$ and $L_g$ are the resistance and inductance on grid transmission line. The system parameters are listed in Table I.

TABLE 1

PV System Parameters

| Description | Parameters | Value |
|---|---|---|
| Power base | $S_{base}$ | 400 kW |
| Power level | P | 0.935 pu |
| System frequency | $f_{base}$ | 60 Hz |
| Converter filter | $R_1$ | 0.15/50 pu |
| | $X_1$ | 0.15 pu |
| Shunt capacitor | $C_1$ | 0.25 pu |

TABLE 1-continued

PV System Parameters

| Description | Parameters | Value |
|---|---|---|
| DC-link capacitor | $C_{dc}$ | 0.054 F |
| Transmission line | $R_g$ | 0.1 $X_g$ |
| Inner loop | $K_{pi}$, $K_{ii}$ | 0.3, 5 |
| DC-link control loop | $K_{pp}$, $K_{ip}$ | 1, 100 |
| $V_{ac}$ control loop | $K_{pv}$, $K_{iv}$ | 1, 100 |
| PLL | $K_{p,PLL}$, $K_{i,PLL}$ | 60, 1400 |

Figure 9A:
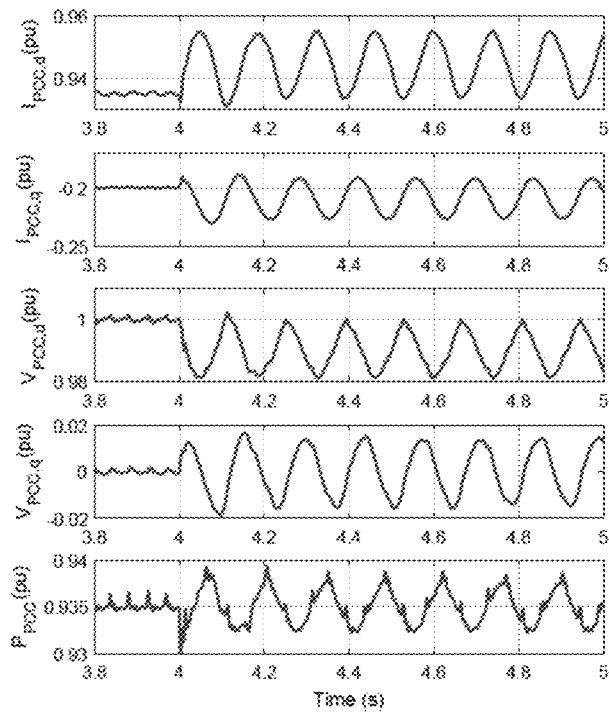
FIG. 9A is a graphical illustration of 7.5 Hz oscillation observed in the EMT testbed of FIG. 8A on the AC side.
Figure 9B:
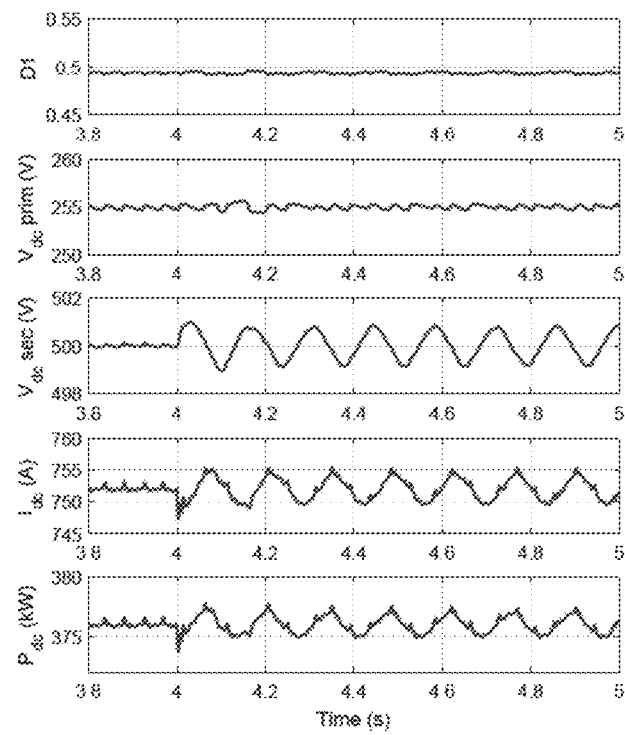
FIG. 9B is a graphical illustration of 7.5 Hz oscillation observed in the EMT testbed of FIG. 8A on the DC side.

7.5 Hz low-frequency oscillations can be observed in FIG. 9 when the transmission line impedance $X_g$ is 1.0 pu and the PCC voltage control order steps from 1.0 pu to 0.99 pu at t=4 s. Both the ac side and the dc side measurements are presented in FIG. 9.

The admittance measurement testbed is set up to have the PV farm connected to a small impedance ($X_g$=0.1 and $R_g$=0.01 pu) to a voltage source. The voltage source's $v_{gd}$ and $v_{gq}$ are configured so that the real power, reactive power from the PCC bus to the grid remains the same between the EMT testbed and the measurement testbed.

Figure 10:
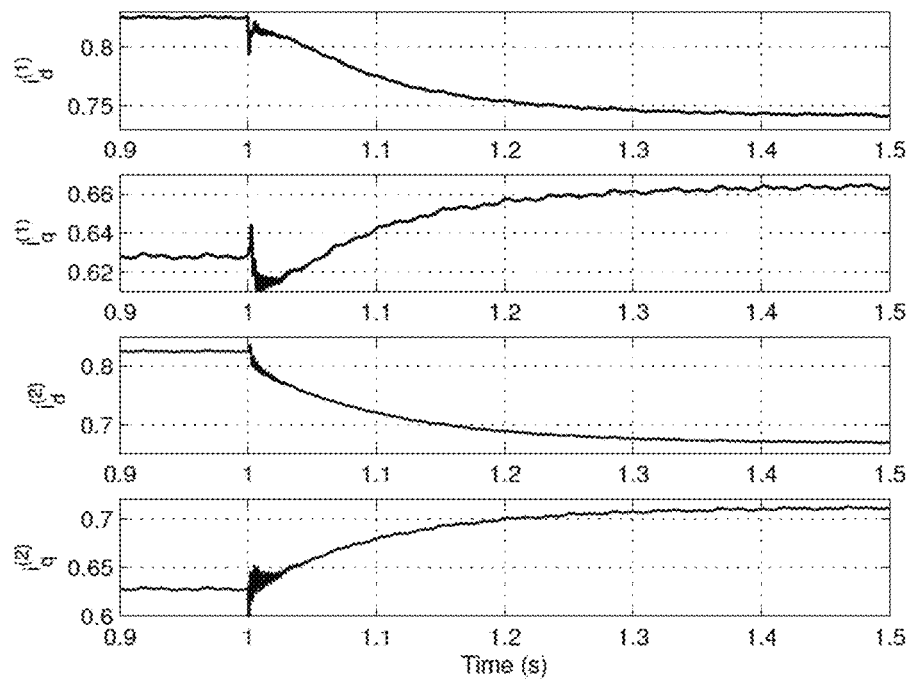
FIG. 10 is a graphical illustration of two sets of data generated by applying small signal perturbations to the EMT testbed of FIG. 8A.

Two sets of data are generated by applying small signal perturbations (0.02 pu) on $v_{g,d}^g$ and $v_{g,q}^g$, respectively. FIG. 10 presents the data. The data are resampled to having a sampling frequency of 4 kHz. It can be observed that noises and harmonics exist even at steady-state.

ERA and DMD tools will be applied to handle the two sets of the data (each set has two time-domain signals) to identify the s-domain admittance and reconstruct the signals.

For DMD, the measurement data from 1 second to 1.5 seconds, with their initial values taken off, will be used. As a total, there are four measurements. The data matrix X will have a dimension of 4×2000. On the other hand, the order of the system is much higher than 4 and DMD will not be able to lead to a system matrix of higher order.

In this exemplary embodiment, the stacking number $s_t$ is chosen to be half of the total snapshot number (N=2000 and $s_t$=1000). This number is also used in the ERA exemplary embodiment. The dimension of the data matrix becomes 4000×1000. Initially, 50-order rank is assumed. DMD outputs a vector b which indicates each eigenvalue's role in the dynamic system. A small absolute value indicates negligible role. Hence a filter can be set up to filter out those eigenvalues whose $|b_j|$ is less than 1% of the maximum 1% max(|b|). The technique is comparable to the denoising technique relying on FFT coefficients. With this filtering procedure, a 10th order model is obtained.

Figure 11:
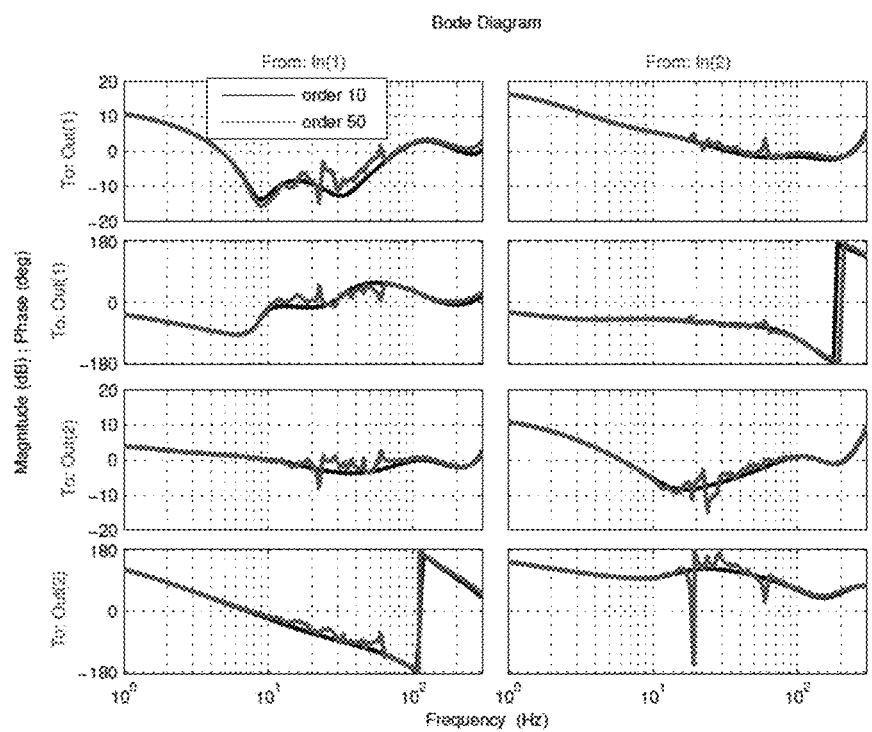
FIG. 11 illustrates Bode diagrams illustrating a comparison of $50^{th}$ order model and $10^{th}$ order model from dynamic mode decompositions (DMD), in accordance with an embodiment of the present invention.

FIG. 11 presents the Bode plots of the 50th order model and the 10th order model. It can be seen that the reduced order model leads to much smoother Bode plots.

Figure 12A:
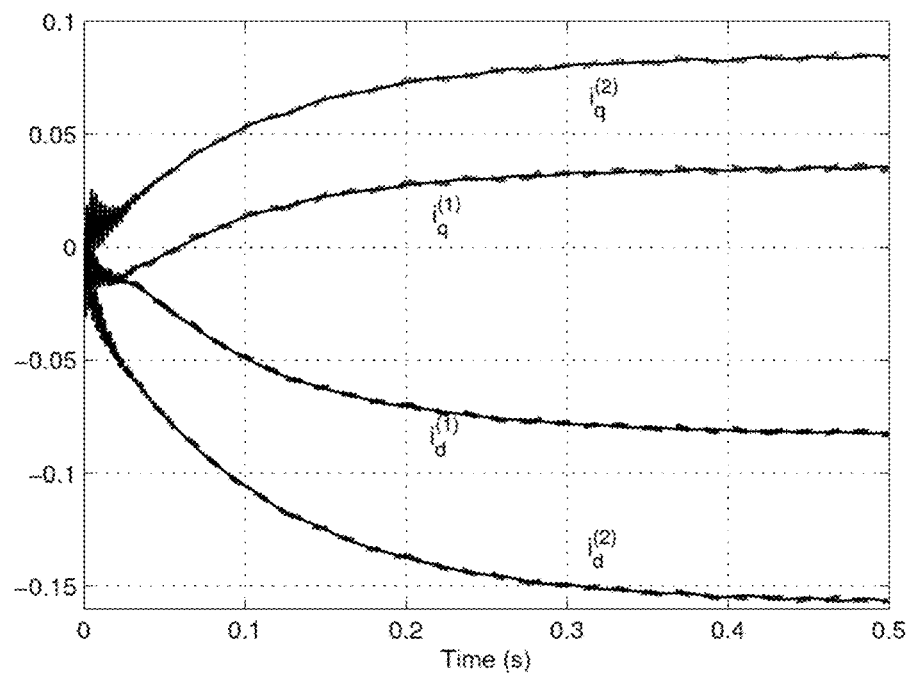
FIG. 12A is a graphical illustration of reconstructed signals verses the original measurements, wherein the dotted line represents the original measurements, the thin solid line represents the reconstructed signals.
Figure 12B:
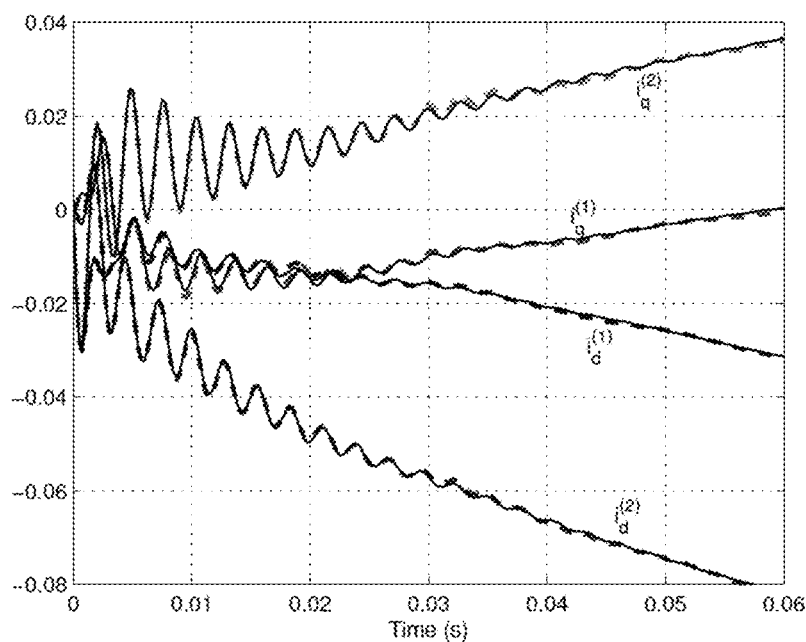
FIG. 12B is a zoomed-in version of FIG. 12A.

The measurement signals can be reconstructed using the reduced-order system and various methods known in the art. FIG. 12 presents the original signals in dash-dotted lines and the reconstructed signals in black thick solid lines. To provide a better view, a zoom-in diagram is also provided. It can be observed that excellent match has been achieved.

In another embodiment, ERA is also applied to the data set to carry out identification. Similarly, a denoising procedure is also applied.

For the EMT testbed with instantaneous voltage and currents as state variables, it is not possible to directly obtain a linearized model via numerical perturbation since state variable are periodic. To validate the admittance identified by DMD and ERA, the harmonic injection method is applied to measure the admittance.

Figure 13:
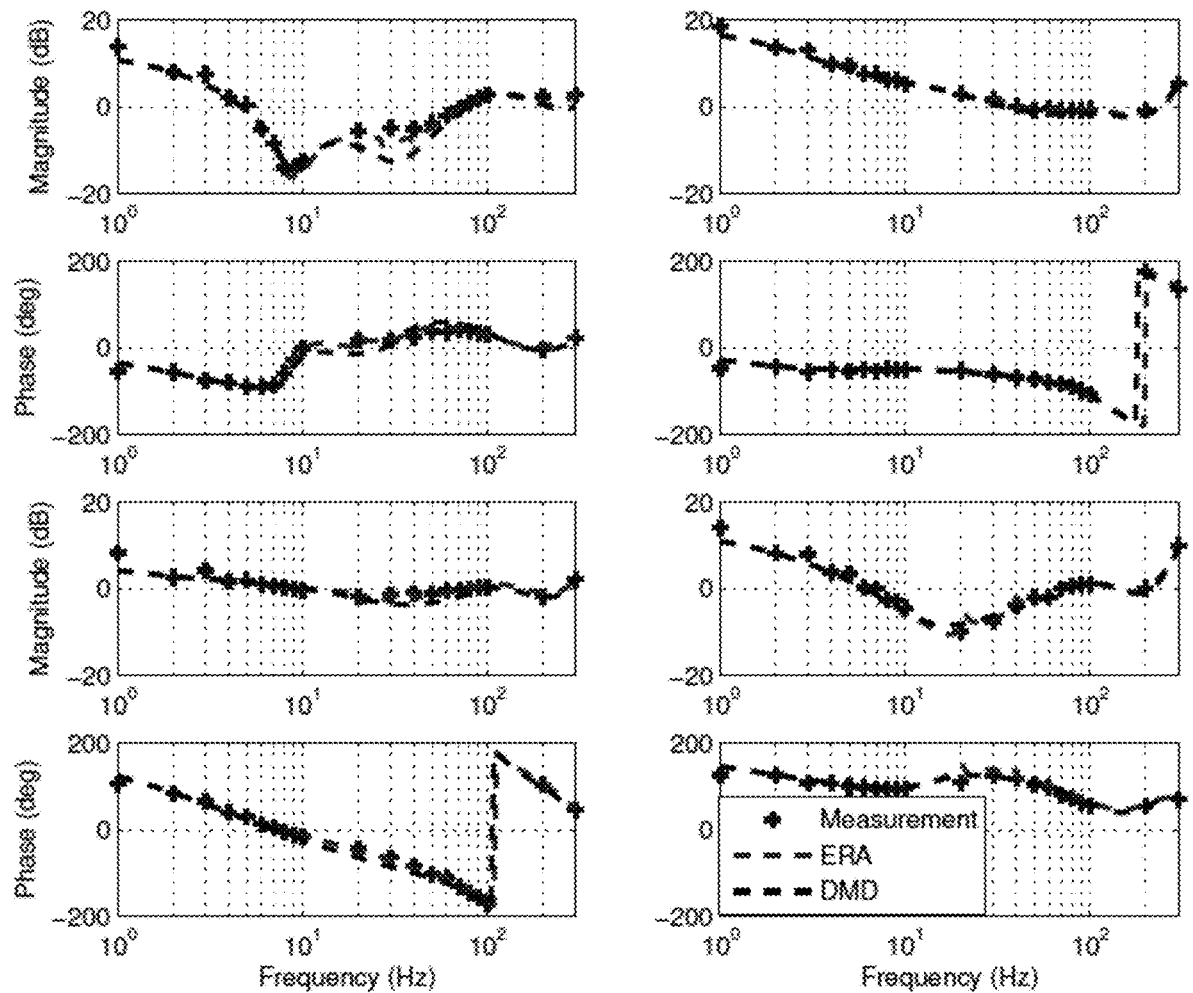
FIG. 13 is a graphical illustration comparing the Bode plots of the admittance models obtained from ERA, DMD and the harmonic injection method.

FIG. 13 presents the comparison of the two s-domain models with the admittance measurement from the harmonic injection method. They show excellent match.

It should be noted that the DMD and ERA identified models are s-domain models and can be directly used for eigenvalue computing relying on s-domain admittance. The harmonic injection leads to measurements. To obtain s-domain model from the harmonic injection method, a vector fitting procedure needs to be carried out.

Finally, stability analysis for weak grid operation is carried out and the closed-loop system eigenvalues are shown in FIG. 14. It can be seen that when the grid strength reduces, an oscillation mode at 7 Hz moves to the right half plane and $X_g=1.02$ is identified as a marginal condition. This result corroborates with the EMT simulation results in FIG. 9.

Figure 8B:
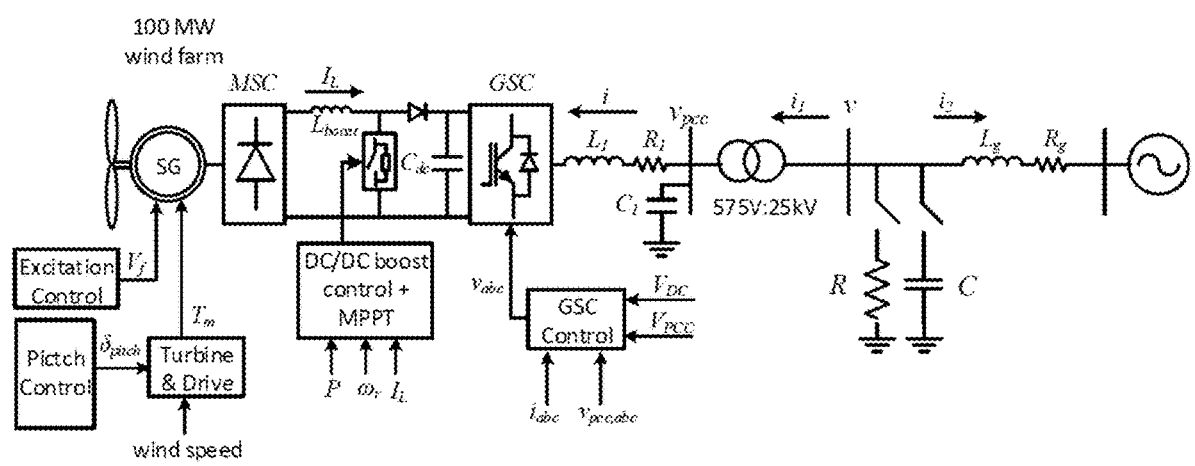
FIG. 8B illustrates an electromagnetic transient (EMT) testbed comprising a 100-MW grid-connected type-4 wind farm, in accordance with an exemplary embodiment of the present invention.

In an exemplary embodiment, admittance measurement of a type-4 wind farm using two sets of event data is presented. A 100-MW wind farm grid integration system is shown in FIG. 8B. The EMT testbed is developed based on the type-4 wind farm demo system in MATLAB/SimPowerSystems. The type-4 wind turbine model includes a synchronous generator, the mechanical system and control, a three-phase rectifier, a dc-dc booster and control, and a dc/ac converter and control. Average models are adopted for the dc/dc booster and the dc/ac converter. The type-4 wind farm consists of 50 2-MW wind turbines and the terminal ac voltage level is 575 V. This farm is connected to a grid through a 575 V/25 kV step-up transformer. The exporting power of the wind farm is 100 MW with the wind speed assumes to be 15 m/s. The measurement data collected are all scaled to pu values.

The power base is 111 MW and the wind farm is exporting level is 0.9 pu or 100 MW.

Its PCC bus voltage is controlled at 1 pu or nominal level. The distribution line has a total reactance $X_g=0.4$ pu and a total resistance of $R_g=0.04$ pu. At a bus notated for v, a resistive load consuming 0.1 pu real power or a capacitor injecting 0.1 pu reactive power may be connected. Two events are simulated.

For the first event, the bus is supplying the resistive load at the beginning. At t=5 seconds, the resistive load is disconnected. The three-phase bus voltage v, the current to the wind farm $i_1$, and the current to the grid $i_2$ are all measured and converted to the dq-frame.

Figure 15A:
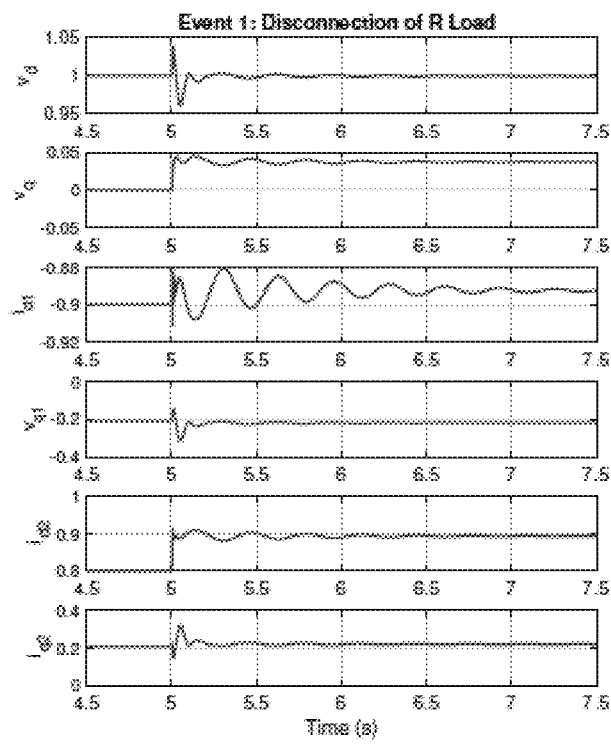
FIG. 15A is a graphical illustration of event data resulting from a resistive load disconnection, in accordance with an embodiment of the present invention.
Figure 15B:
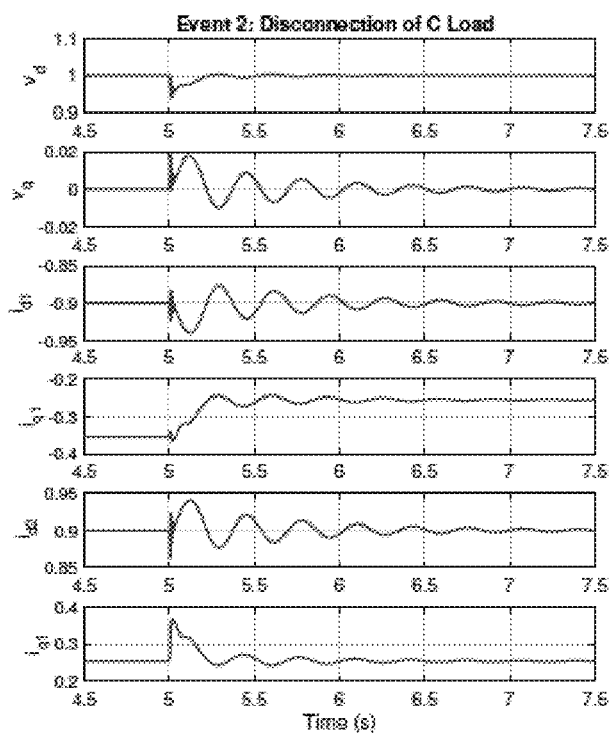
FIG. 15B is a graphical illustration of event data resulting from a capacitive load disconnection, in accordance with an embodiment of the present invention.

For the second event, the bus is connected for the capacitor at the beginning. At t=5 seconds, the capacitor is disconnected. Using the aforementioned procedure, the event data in the dq-frame are obtained. The two sets of the event data are presented in FIG. 15. The simulation data has a sampling rate of 50 µs.

The two sets of the data will be notated using superscript (i) to notate with event. For each set of the data, the s-domain expression of the six signals will be learned using ERA. 1 second data from 5 seconds to 6 seconds are used for learning. The data are resampled to have a sampling frequency of 2000 Hz. The system order is assumed to be 25.

With s-domain expressions of all measurements known, the dq-frame admittance is to be sought. When the wind farm is operating at the same condition, its admittance will be kept the same. Hence it is true that the current and voltage for different events are related with the same admittance:

$$\underbrace{\begin{bmatrix} i_{d1}^{(1)}(s) & i_{d1}^{(2)}(s) \\ i_{q}^{(1)}(s) & i_{q}^{(2)}(s) \end{bmatrix}}_{I(s)} = Y_{wind}(s) \underbrace{\begin{bmatrix} v_{d1}^{(1)}(s) & v_{d1}^{(2)}(s) \\ v_{q}^{(1)}(s) & v_{q}^{(2)}(s) \end{bmatrix}}_{V(s)} \quad (18)$$

Thus, the wind farm admittance at any frequency ω can be found using the following equation.

$$Y_{wind}(j\omega) = I(j\omega)V(j\omega)^{-1} \quad (19)$$

If there are m events and m>2, we may have the current and voltage measurement matrices as fat matrices, with a column dimension of m: $I(j\omega), V(j\omega) \in \mathcal{C}^{2 \times m}$. Thus, pseudo inverse or Moore-Penrose inverse of the voltage measurement matrix may be used.

Eq. (19) can be changed as follows:

$$Y_{wind}(j\omega) = I(j\omega)V(j\omega)^{\dagger} \quad (20)$$

where † refers to Moore-Penrose inverse.

From the current measurements of the transmission line, one may also find the admittance measurement of the transmission line. For the EMT testbed, the transmission line is represented by a series RL component and the parameters are given as $R_g=0.04$ pu and $X_g=0.4$ pu. Hence, its true dq-frame admittance can be found using (17).

One can compare the line admittance from the measurement data with the true line admittance. If they agree with each other, that means the method leads to reasonable admittances for both line and the wind farm.

Figure 16:
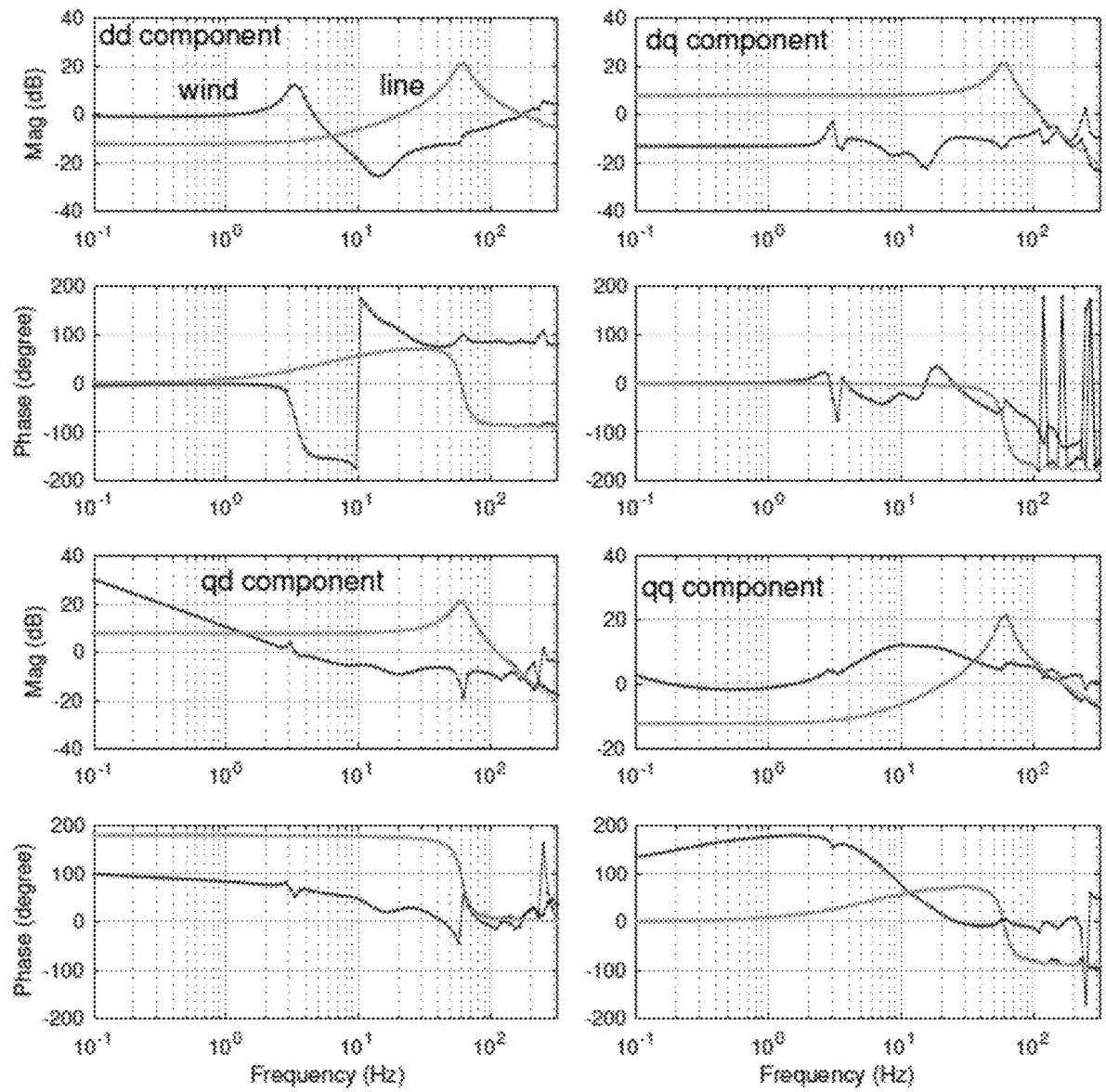
FIG. 16 is a graphical illustration of the dq-frame admittance measurements of the wind farm, the line and the true admittance of the line, in accordance with an embodiment of the present invention.

FIG. 16 presents the dq-frame admittance measurements of the wind farm, the line and the true admittance of the line. It can be seen that for the line, the admittance measurement and the true admittance match very well for frequency below 100 Hz. Thus, it is also concluded that the wind farm admittance measurement below 100 Hz can be used for analysis.

The proposed method leads to real-time admittance measurement using multiple event data. Compared to the current impedance measurement unit technology, this method does not require any additional hardware to inject perturbations into a system.

The innovation of the present invention is admittance identification using time-domain data via a critical step: obtaining s-domain expressions of measurements. Compared to the state-of-the art approach, i.e., harmonic injection method, the proposed approach of the present invention is much more efficient. The system and method of the present invention requires only two sets of data to lead to a dq-frame admittance. The proof-of-concept has been demonstrated using an analytical model. Two IBR grid-integration EMT testbeds were utilized to demonstrate the two admittance identification procedures. Specifically, an application of using event data for real-time admittance identified has been demonstrated.

Hardware and Software Infrastructure Examples

The present invention may be embodied on various platforms. The following provides an antecedent basis for the information technology that may be utilized to enable the invention.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The machine-readable medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A machine-readable signal medium may include a propagated data signal with machine-readable program code embodied therein, for example, in baseband or as part of a carrier wave. Such a propagated signal may take any of a variety of forms, including, but not limited to, electro-magnetic, optical, or any suitable combination thereof. A machine-readable signal medium may be any machine-readable medium that is not a computer readable storage medium and that can communicate, propagate, or transport a program for use by or in connection with an instruction execution system, apparatus, or device. However, as indicated above, due to circuit statutory subject matter restrictions, claims to this invention as a software product are those embodied in a non-transitory software medium such as a computer hard drive, flash-RAM, optical disk or the like.

Program code embodied on a machine-readable medium may be transmitted using any appropriate medium, including but not limited to wireless, wire-line, optical fiber cable, radio frequency, etc., or any suitable combination of the foregoing. Machine-readable program code for carrying out operations for aspects of the present invention may be written in any combination of one or more programming languages, including an object oriented programming language such as Java, C#, C++, Visual Basic or the like and conventional procedural programming languages, such as the "C" programming language or similar programming languages.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by machine-readable program instructions.

The advantages set forth above, and those made apparent from the foregoing disclosure, are efficiently attained. Since certain changes may be made in the above construction without departing from the scope of the invention, it is intended that all matters contained in the foregoing disclosure or shown in the accompanying drawings shall be interpreted as illustrative and not in a limiting sense.

What is claimed is:

1. A method for admittance identification of a grid-connected inverter-based resource (IBR), the method comprising:
   capturing transient data in response to at least two independent time-domain events on a bus between a grid-connected IBR and a power grid;
   sampling the captured transient data to generate sampled transient data;
   generating an s-domain expression of the transient data from the sampled transient data; and
   identifying a dq-frame admittance model of the IBR from the s-domain expression of the transient data.

2. The method of claim 1, wherein the at least two independent time-domain events comprises a first time-domain event and a second time-domain event and wherein the method further comprises:
   capturing a first set of transient data in response to the first time-domain event; and
   capturing a second set of transient data in response to the second time-domain event.

3. The method of claim 1, wherein the at least two independent time-domain events are step change events.

4. The method of claim 1, wherein the at least two independent time-domain events are voltage perturbations on the bus and wherein capturing the transient data in response to the at least two independent time-domain events on the bus comprises measuring a transient current flowing to the IBR.

5. The method of claim 1, wherein the at least two independent time-domain events are voltage perturbations on the bus and wherein capturing the transient data in response to the at least two independent time-domain events on the bus comprises measuring a transient voltage time-series data at a terminal voltage of the IBR.

6. The method of claim 1, wherein sampling the captured transient data to generate the sampled transient data comprises sampling the captured transient data at equal intervals and wherein generating the s-domain expression of the transient data further comprises
   applying an Eigensystem Realization Algorithm (ERA) to the sampled transient data to generate the s-domain expression of the transient data.

7. The method of claim 1, wherein sampling the captured transient data to generate the sampled transient data comprises sampling the captured transient data at equal intervals and wherein generating the s-domain expression of the transient data further comprises
   applying dynamic mode decomposition (DMD) to the sampled transient data to generate the s-domain expression of the transient data.

8. The method of claim 7, further comprising denoising the s-domain expression of the transient data.

9. The method of claim 1, wherein the transient data is captured during real-time operation of the IBR.

10. The method of claim 1, wherein the at least two independent time-domain events are the result of external perturbations outside of the IBR device.

11. The method of claim 1, wherein the IBR is a wind resource or a photovoltaic solar resource.

12. A method for admittance identification of a grid-connected voltage source converter inverter-based resource (IBR), the method comprising:
   capturing a first set of transient data in response to a first time-domain event on a bus between a grid-connected inverter-based resource (IBR) and) a power grid, wherein the first set of transient data comprises transient data for a first current flowing to the IBR in response to the first time-domain event on the bus and a first transient data for a bus voltage;

capturing a second set of transient data in response to a second time-domain event on the bus between the IBR and the power grid, wherein the second time-domain event is independent of the first time-domain event and wherein the second set of transient data comprises transient data for a second current flowing to the IBR in response to the second time-domain event on the bus and a second transient data for the bus voltage; and identifying a dq-frame admittance model of the grid-connected IBR from the first set of transient data and the second set of transient data.

13. The method of claim 12, further comprising:

sampling the captured transient data at equal intervals to generate sampled transient data; and applying an Eigensystem Realization Algorithm (ERA) to the sampled transient data to generate an s-domain expression of the transient data.

14. The method of claim 12, further comprising:

sampling the captured transient data at equal intervals to generate sampled transient data; and applying dynamic mode decomposition (DMD) to the sampled transient data to generate an s-domain expression of the transient data.

15. The method of claim 13, further comprising denoising the s-domain expression of the transient data.

16. The method of claim 14, further comprising denoising the s-domain expression of the transient data.

17. A system for measuring an admittance of a grid-connected inverter-based resource (IBR), the system comprising:

a measurement unit coupled to a point of interconnection (POI) between a power grid and an inverter-based resource (IBR);

the measurement unit for:

capturing transient data in response to at least two independent time-domain events on a bus between the IBR and the power grid;

sampling the captured transient data to generate sampled transient data;

generating an s-domain expression of the transient data from the sampled transient data; and identifying a dq-frame admittance model of the IBR from the s-domain expression of the transient data.

18. The system of claim 17, wherein the at least two independent time-domain events are voltage perturbations on the bus and wherein capturing the transient data in response to the at least two independent time-domain events on the bus comprises measuring a transient current flowing to the IBR.

19. The system of claim 17, wherein the at least two independent time-domain events are voltage perturbations on the bus and wherein capturing the transient data in response to the at least two independent time-domain events on the bus comprises measuring a transient voltage time-series data at the POI.

20. The system of claim 17, wherein the IBR is a wind resource or a photovoltaic solar resource.

\* \* \* \* \*